(12) United States Patent
Street (10) Patent No.: US 11,658,129 B2
(45) Date of Patent: May 23, 2023

(54) ELECTRICALLY OR TEMPERATURE ACTIVATED SHAPE-MEMORY MATERIALS FOR WARPAGE CONTROL

(71) Applicant: Micron Technology, Inc., Boise, ID (US)

(72) Inventor: Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 16/950,379

(22) Filed: Nov. 17, 2020

(65) Prior Publication Data

US 2021/0066212 A1    Mar. 4, 2021

Related U.S. Application Data

(63) Continuation of application No. 16/036,697, filed on Jul. 16, 2018, now Pat. No. 10,861,797.

(51) Int. Cl.
| | |
|---|---|
| *H01L 23/48* | (2006.01) |
| *H01L 23/00* | (2006.01) |
| *H01L 23/373* | (2006.01) |
| *H01L 21/326* | (2006.01) |
| *H01L 21/324* | (2006.01) |
| *F03G 7/06* | (2006.01) |

(52) U.S. Cl.
CPC .......... *H01L 23/562* (2013.01); *H01L 21/326* (2013.01); *H01L 21/3247* (2013.01); *H01L 23/373* (2013.01); *F03G 7/065* (2013.01)

(58) Field of Classification Search
CPC ............. H01L 24/01–18; H01L 23/562; H01L 23/373; F03G 7/0614–0615; F03G 7/065
See application file for complete search history.

(56) References Cited

U.S. PATENT DOCUMENTS

| 8,143,721 B2 | 3/2012 | Ongchin et al. |
| 9,978,716 B2 | 5/2018 | Tsao et al. |
| (Continued) | | |

FOREIGN PATENT DOCUMENTS

CN    103038877 A    4/2013

OTHER PUBLICATIONS

US Patent and Trademark Office; Office Action for U.S. Appl. No. 16/036,697 dated Aug. 7, 2019.
(Continued)

*Primary Examiner* — Hoa B Trinh
(74) *Attorney, Agent, or Firm* — Perkins Coie LLP (57) ABSTRACT

A semiconductor device assembly including a shape-memory element connected to at least one component of the semiconductor device assembly. The shape-memory element may be temperature activated or electrically activated. The shape-memory element is configured to move to reduce, minimize, or modify a warpage of a component of the assembly by moving to an initial shape. The shape-memory element may be applied to a surface of a component of the semiconductor device assembly or may be positioned within a component of the semiconductor device assembly such as a layer. The shape-memory element may be connected between two components of the semiconductor device assembly. A plurality of shape-memory elements may be used to reduce, minimize, and/or modify warpage of one or more components of a semiconductor device assembly.

10 Claims, 5 Drawing Sheets

(56) References Cited

U.S. PATENT DOCUMENTS

| | | |
|---|---|---|
| 10,861,797 B2* | 12/2020 | Street .................. H01L 21/326 |
| 2009/0085228 A1 | 4/2009 | Sun |
| 2011/0147895 A1 | 6/2011 | Bai et al. |
| 2014/0061893 A1 | 3/2014 | Saeidi et al. |
| 2014/0145324 A1 | 5/2014 | Uchibori et al. |
| 2015/0320295 A1 | 11/2015 | Belson et al. |
| 2016/0193810 A1 | 7/2016 | Kang et al. |
| 2017/0178987 A1* | 6/2017 | Kumar .................. H01L 23/16 |
| 2019/0085436 A1* | 3/2019 | Nili Ahmadabadi ..... F03G 7/06 |

OTHER PUBLICATIONS

US Patent and Trademark Office; Office Action for U.S. Appl. No. 16/036,697 dated Feb. 20, 2020.
CN Patent Application No. 201910631167.0—Chinese Office Action and Search Repod, dated Feb. 2, 2023, with English Translation, 15 pages.

* cited by examiner

ELECTRICALLY OR TEMPERATURE ACTIVATED SHAPE-MEMORY MATERIALS FOR WARPAGE CONTROL

RELATED APPLICATIONS

The present application is a continuation patent application of U.S. patent application Ser. No. 16/036,697 entitled Electrically or Temperature Activated Shape-Memory Materials for Warpage Control filed on Jul. 16, 2018 and published as U.S. Patent App. Pub. No. 2020/0020646 on Jan. 16, 2020, which is incorporated by reference herein in its entirety.

FIELD

The embodiments described herein relate to shape-memory materials that may reduce or minimize warpage of a semiconductor device during processing and methods of using such shape-memory materials to reduce or minimize warpage of a semiconductor device. The shape-memory materials may be temperature or electrically activated.

BACKGROUND

Semiconductor processing and packaging techniques continue to evolve to meet industry demands for increased performance and reduced size. Electronic products, such as cell phones, smart phones, tablets, personal digital assistants, laptop computers, as well as other electronic devices, require packaged semiconductor assemblies having a high density of devices while having a relatively small footprint. For example, the space available for memory devices, processors, and other devices, continues to decrease in electronic products providing a need to increase the density of semiconductor devices. The thickness of semiconductor devices is continually being decreased to reduce the size of semiconductor device packages. One method to increase the density of semiconductor devices is stacking of semiconductor devices to form a semiconductor device assembly.

During the process of forming a semiconductor device assembly, the assembly may go through various processes having an elevated temperature. For example, the temperature during a reflow process to create solder joints, or interconnections, between semiconductor devices may reach an elevated temperature, such as 260 degrees Celsius. The elevated temperature may vary depending on the components of the semiconductor device assembly as well as the processes being used to form the assembly as would be appreciated by one of ordinary skill in the art. As another example, during a thermo-compression bonding (TCB) process, the semiconductor device assembly is subjected to an elevated temperature, which may result in undesired warpage of the semiconductor device components in the assembly.

A semiconductor device assembly may be comprised of various components such as, but not limited to, a substrate, semiconductor devices, and mold compound. Each of the components may have different coefficients of thermal expansion (CTE), which may create potential problems. As the semiconductor device assembly is subjected to an elevated temperature, the semiconductor device assembly may experience warpage due to the different CTEs of the individual components of the assembly. Warpage may provide a large amount of stress on the components of the assembly. If the warpage is too large, the warpage may create reliability issues with the interconnections within a semiconductor device assembly. For example, a warpage larger than, but not limited to, 50 microns may result in solder joint reliability issues.

Warpage due to CTE mismatch may create problems in connecting a semiconductor device assembly to a board or substrate. Likewise, CTE mismatch may also create problems in connecting a first semiconductor device to a second semiconductor device. The first semiconductor device may have a first warpage at an expected reflow temperature and the second semiconductor device may have a second warpage that differs from the first warpage at the expected reflow temperature. The differences between the first and second warpage may make it very difficult to connect the first semiconductor device to the second semiconductor device. For example, warpage may cause a break in an interconnect between the two semiconductor devices if the warpage increases the distance between the two semiconductor devices. Conversely, warpage may cause a short between two adjacent interconnects if the warpage decreases the distance between the two semiconductor devices. A decrease in distance may cause the interconnect material, which may be solder, to expand laterally towards an adjacent interconnect as would be appreciated by one of ordinary skill in the art having the benefit of this disclosure.

Additional drawbacks and disadvantages may exist.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a semiconductor device assembly comprising a first semiconductor device and a substrate with the first semiconductor device being connected to the substrate. The assembly comprises a first element configured of a shape-memory material connected to the first semiconductor device. The first element is configured to return to an initial shape to reduce a warpage of the first semiconductor device at the first predetermined temperature.

An embodiment of the disclosure is a semiconductor device assembly comprising a semiconductor device having a warpage at a predetermined temperature and at least one temperature activated shape-memory element connected to the semiconductor. The at least one temperature activated shape-memory element is configured to move to an initial shape to reduce the warpage of the semiconductor device at the predetermined temperature.

An embodiment of the disclosure is a method of making a semiconductor device assembly comprising providing a substrate and providing a first semiconductor device. The method comprises providing a first temperature activated shape-memory element connected to the first semiconductor device and connecting the first semiconductor device to the substrate. The method comprises heating the semiconductor device assembly to a first predetermined temperature, wherein the first temperature activated shape-memory element moves to an initial shape to reduce a warpage of the first semiconductor device at the first predetermined temperature.

An embodiment of the disclosure is a semiconductor device assembly comprising a semiconductor device having a warpage at a predetermined temperature and at least one electrically activated shape-memory element connected to the semiconductor device. As used herein, "electrically activated," "electricity," or the application of "electricity" means applying a suitable voltage, current, and/or charge to the shape-memory element as would be appreciated by one of ordinary skill in the art having the benefit of this disclosure. The at least one electrically activated shape-memory element is configured to move to an initial shape to modify or reduce the warpage of the semiconductor device upon the application of electricity to the at least one electrically activated shape-memory element.

An embodiment of the disclosure is a method of making a semiconductor device assembly comprising providing a substrate, providing a semiconductor device, and connecting the semiconductor device to the substrate. The method comprises providing an electrically activated shape-memory element connected to the semiconductor device and applying electricity to the electrically activated shape-memory element to modify a warpage of the semiconductor device.

Figure 1:
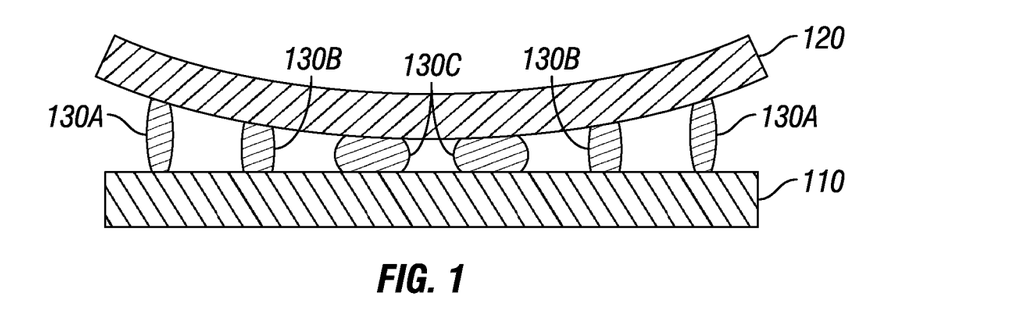
FIG. 1 is a schematic of an embodiment of a semiconductor device assembly comprised of a semiconductor device connected to a substrate via a plurality of interconnects.

FIG. 1 is a schematic of a semiconductor device assembly 100. The semiconductor device assembly 100 includes a first semiconductor device 120 connected to a substrate 110 via a plurality of interconnects 130A, 130B, 130C. The substrate 110 may be a semiconductor device as would be appreciated by one of ordinary skill in the art having the benefit of this disclosure. As shown in FIG. 1, the first semiconductor device 120 may have a warpage at a predetermined temperature. The predetermined temperature may be a temperature applied to the semiconductor device assembly 100 during processing. For example, the predetermined temperature may be, but is not limited to, the temperature the assembly is heated to during a TCB process or during a reflow process.

Warpage of the first semiconductor device 120 at the predetermined temperature may cause the stretching of some of the interconnects 130A between the first semiconductor device 120 and the substrate 110. The stretching of the interconnects 130A may lead to breaks in the interconnects 130A as would be appreciated by one of ordinary skill in the art having the benefit of this disclosure. Warpage of the first semiconductor device 120 at the predetermined temperature may also cause the compression of some interconnects 130C causing the interconnects 130C to expand laterally, which may cause shorts between interconnects 130C as would be appreciated by one of ordinary skill in the art having the benefit of this disclosure. The number, shape, size, and/or location of the interconnects 130A, 130B, 130C are shown for illustrative purposes and may be varied as would be appreciated by one of ordinary skill in the art having the benefit of this disclosure. Likewise, the warpage of the first semiconductor device 120 is shown for illustrative purpose and may vary depending on the application as would be appreciated by one of ordinary skill in the art having the benefit of this disclosure.

Figure 2:
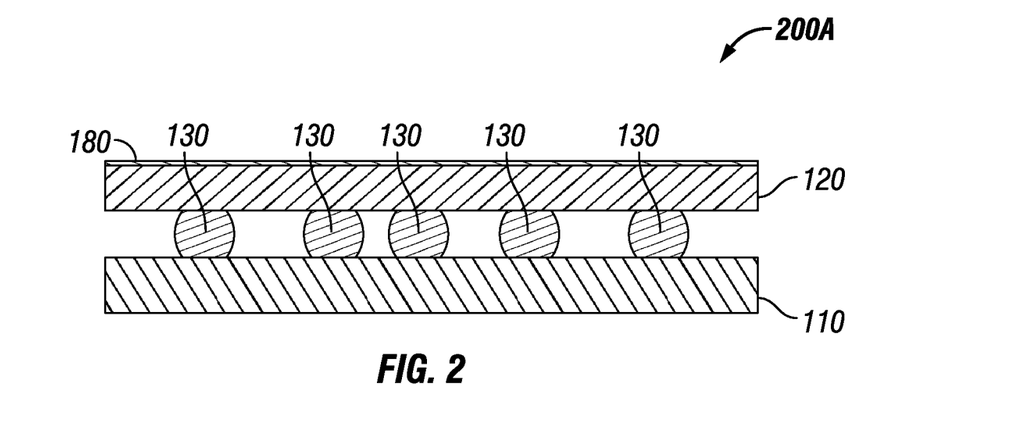
FIG. 2 is a schematic of an embodiment of a semiconductor device assembly comprised of a temperature activated shape-memory element connected to a semiconductor device that is connected to a substrate via a plurality of interconnects.

FIG. 2 is a schematic of a semiconductor device assembly 200A. The semiconductor device assembly 200A includes a first semiconductor device 120 connected to a substrate 110 via a plurality of interconnects 130. The substrate 110 may be a semiconductor device as would be appreciated by one of ordinary skill in the art having the benefit of this disclosure. As discussed herein, the first semiconductor device 120 and/or substrate 110 may have a warpage at a predetermined temperature, which may be applied to the semiconductor device assembly 100 during processing. The warpage of the semiconductor device 120 and/or the substrate 110 may lead to inadequate interconnects 130 within the semiconductor device assembly 100. The semiconductor device assembly 100 includes at least one shape-memory element 180 that is configured reduce the warpage of the semiconductor device 120 and/or the substrate 110. FIG. 2 shows the shape-memory element 180 connected to a surface of the semiconductor device 120. The shape-memory element 180 is configured to return to an initial shape at the predetermined temperature. Alternatively, the shape-memory element 180 may be configured to return to the initial shape upon the application of electricity to the shape-memory element 180 as discussed herein. For example, the initial shape of the shape-memory element 180 may be a relatively flat layer that helps to reduce or minimize the warpage of the semiconductor device 120. The shape-memory element 180 could also be positioned on the substrate 110 as would be appreciated by one of ordinary skill in the art. The size, shape, location, and configuration of the shape-memory element 180 is shown for illustrative purposes and may be varied depending on the application as would be appreciated by one of ordinary skill in the art having the benefit of this disclosure. For example, the shape-memory element 180 may be multiple elements and may be an interior layer of the semiconductor device 120 and/or substrate 110 as discussed herein.

The shape-memory element 180 may be comprised of various materials as would be appreciated by one of ordinary skill in the art having the benefit of this disclosure. For example, the shape-memory element 140 may be comprised of, but not limited to, a shape-memory alloy such as copper-aluminum-nickel or nickel-titanium or various shape-memory alloys created by alloying zinc, gold, iron, and copper. For example, iron-based and copper-based shape-memory alloys may be iron-manganese-silicon, copper-aluminum-nickel, and copper-zinc-aluminum.

The shape-memory element 180 may be comprised of a various shape-memory materials in various shapes or forms. For example, the shape-memory element 180 may be a layer deposited on top of a surface, discrete elements deposited top of a surface, or may be deposited internally within a semiconductor device 120 and/or substrate 110. For example, the semiconductor device 120 and/or substrate 110 may be comprised of multiple layers with one or more of those layers comprising a shape-memory layer. The shape-memory element 180 is configured to have an initial shape at a predetermined temperature so that when a semiconductor device assembly including the shape-memory element 180 is heated to the predetermined temperature the shape-memory element 180 will reduce or minimize the warpage of at least a component of the semiconductor device assembly by moving to its initial shape. Thus, both the shape and the temperature are configured to counter the expected warpage of a component of a semiconductor device assembly. Alternatively, the shape-memory element 180 may be configured to return to its initial shape to reduce or minimize the warpage of a component upon the application of electricity to the shape-memory element 180.

The warpage of the first semiconductor device 120 and/or substrate 110 at a predetermined temperature may be predetermined by various mechanisms as would be appreciated by one of ordinary skill in the art. For example, the warpage of each element of a semiconductor device assembly 100 may be simulated using thermal shadow moiré (TSM). TSM may be used to determine the potential locations of shape-memory elements 180 to reduce or minimize warpage to reduce interconnect 130 defects. Other mechanisms may be used to determine the potential locations of shape-memory elements 180 to reduce or minimize warpage.

Figure 6:
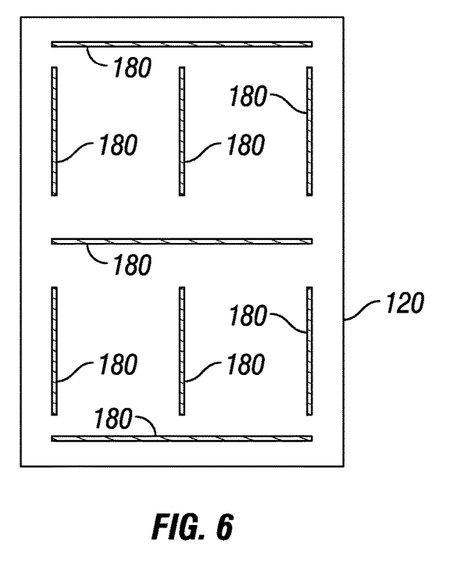
FIG. 6 is a schematic of an embodiment of shape-memory elements in a pattern on a semiconductor device.
Figure 7:
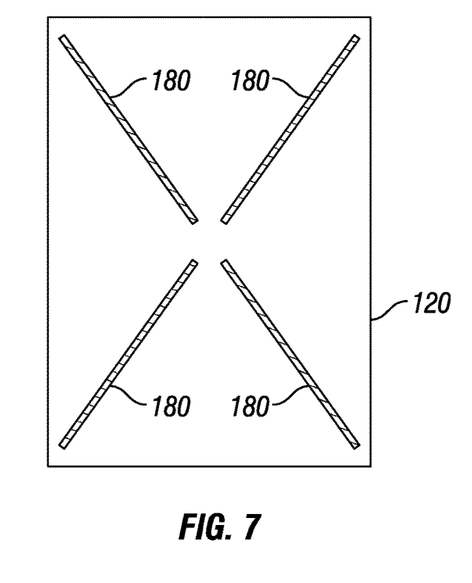
FIG. 7 is a schematic of an embodiment of shape-memory elements in a pattern on a semiconductor device.

Various patterns of shape-memory elements 180 may be used to reduce warpage of a semiconductor device 120 and/or substrate 110 that is part of a semiconductor device assembly 100. FIG. 6 shows a schematic of an embodiment of shape-memory elements 180 in a pattern on a semiconductor device 120. For example, the shape-memory elements 180 may be positioned spaced around the semiconductor device 120 to reduce or minimize warpage of the semiconductor device 120 at a predetermined temperature. FIG. 7 shows a schematic of an embodiment of shape-memory elements 180 in a pattern on a semiconductor device 120. For example, the shape-memory element 180 may extend inward from each corner of the semiconductor device 120. The size, shape, location, and/or number of the shape-memory elements 180, which may be temperature or electrically activated, are shown for illustrative purposes and may be varied depending on the application as would be appreciated by one of ordinary skill in the art having the benefit of this disclosure.

Figure 3:
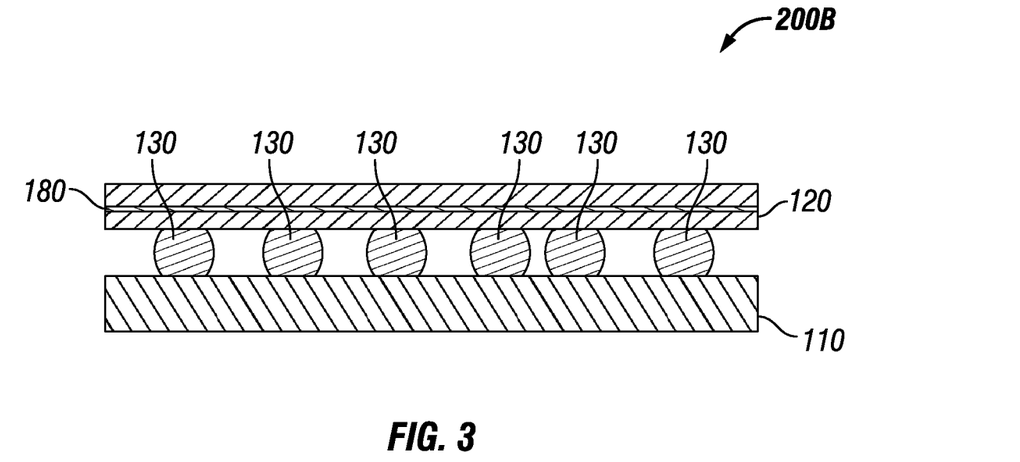
FIG. 3 is a schematic of an embodiment of a semiconductor device assembly comprised of a semiconductor device connected to a substrate via a plurality of interconnects, the semiconductor device including a temperature activated shape-memory element.

FIG. 3 is a schematic of a semiconductor device assembly 200B. The semiconductor device assembly 200B includes a first semiconductor device 120 connected to a substrate 110 via a plurality of interconnects 130. The substrate 110 may be a semiconductor device as would be appreciated by one of ordinary skill in the art having the benefit of this disclosure. As discussed herein, the first semiconductor device 120 and/or substrate 110 may have a warpage at a predetermined temperature, which may be applied to the semiconductor device assembly 100 during processing. The semiconductor device assembly 100 includes at least one temperature activated shape-memory element 180 positioned as a layer of the first semiconductor device 120.

The shape-memory element 180 is configured to reduce the warpage of the first semiconductor device 120 at a predetermined temperature. The shape-memory element 180 is configured to return to an initial shape, shown in FIG. 3, at a predetermined temperature that reduces or minimizes the warpage of the first semiconductor device 120 at the predetermined temperature. More than one shape-memory element 180 may be used as discussed herein. Additionally, the substrate 110 could include one or more shape-memory elements 180 as would be appreciated by one of ordinary skill in the art.

Figure 4:
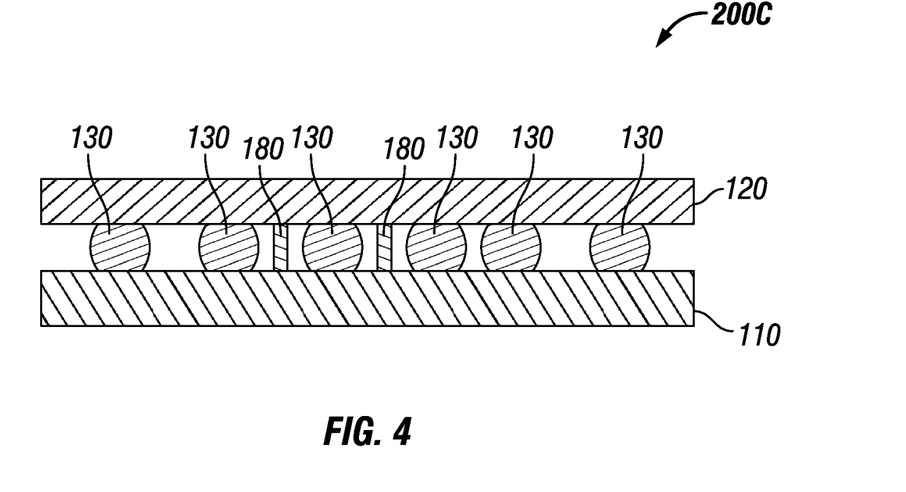
FIG. 4 is a schematic of an embodiment of a semiconductor device assembly comprised of a semiconductor device that is connected to a substrate via a plurality of interconnects and a plurality of temperature activated shape-memory elements.

FIG. 4 is a schematic of a semiconductor device assembly 200C. The semiconductor device assembly 200C includes a first semiconductor device 120 connected to a substrate 110 via a plurality of interconnects 130. The substrate 110 may be a semiconductor device as would be appreciated by one of ordinary skill in the art having the benefit of this disclosure. As discussed herein, the first semiconductor device 120 and/or substrate 110 may have a warpage at a predetermined temperature, which may be applied to the semiconductor device assembly 100 during processing. The semiconductor device assembly 100 includes at least one temperature activated shape-memory element 180 positioned between the substrate 110 and the first semiconductor device 120. The shape-memory elements 180 are configured to return to an initial shape at a predetermined temperature to reduce the warpage of the substrate 110 and/or first semiconductor device 120.

Figure 5A:
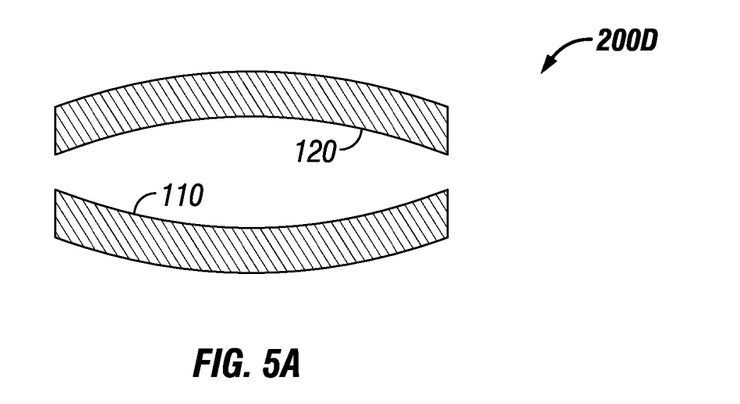
FIG. 5A is a schematic showing a semiconductor device having a first warpage at a temperature and a substrate having a second warpage at the temperature.
Figure 5B:
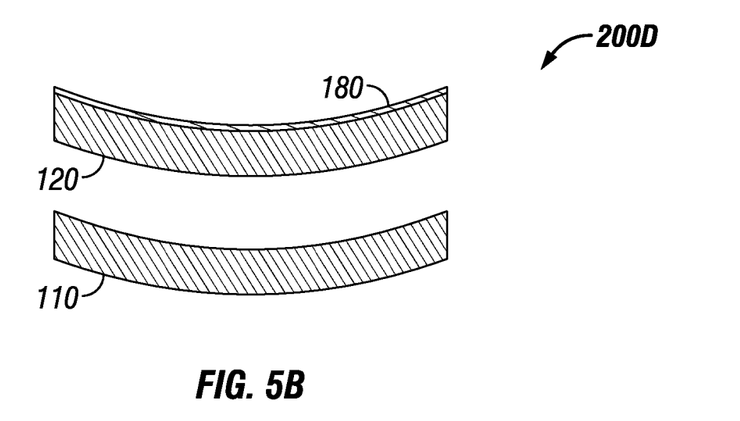
FIG. 5B is a schematic showing a shape-memory element causing a warpage of a semiconductor device to substantially conform to a warpage of a substrate.

FIG. 5A shows a semiconductor device assembly 200D comprised of a first semiconductor device 120 and a substrate 110. The first semiconductor device 120 is to be connected to the substrate 110. However, the first semiconductor device 120 may have a warpage that differs from the warpage of the substrate 110 at a predetermined temperature, as shown in FIG. 5A, making it difficult to properly connect the first semiconductor device 120 to the substrate 110. A shape-memory element 180 may be connected to the first semiconductor device 180 as shown in FIG. 5B. The shape-memory element 180 is configured to return to an initial shape at the predetermined temperature or by the application of electricity that may be used to modify the warpage of the first semiconductor device 120. As shown in FIG. 5B, the shape-memory element 180 may be used to modify the warpage of the first semiconductor device 120 so that it better corresponds to the warpage of the substrate 110. The shape-memory element 180 may be connected to the substrate 110 or on both the semiconductor device 120 and the substrate 110 as would be appreciated by one of ordinary skill in the art having the benefit of this disclosure.

Figure 8:
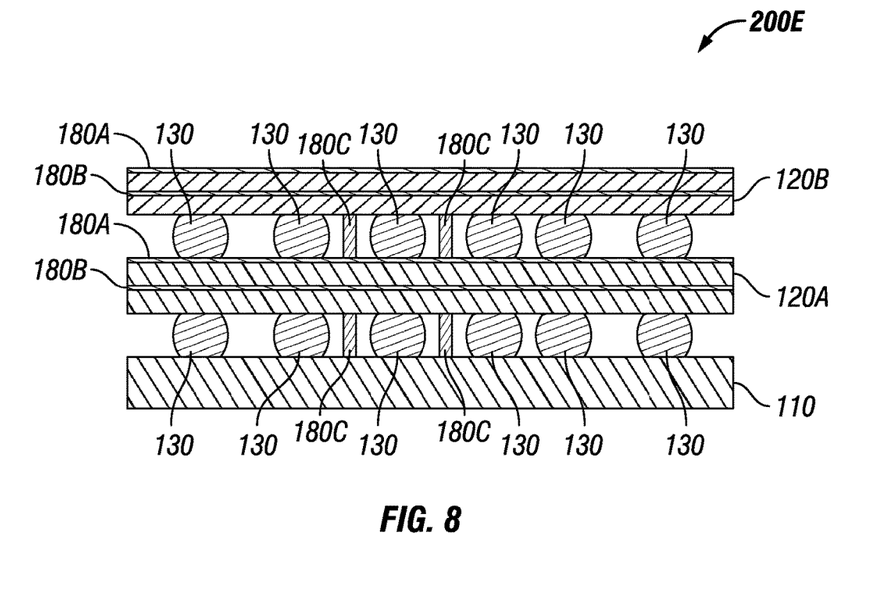
FIG. 8 is a schematic of an embodiment of a semiconductor device assembly comprised of a two semiconductor devices and a substrate being connected to each other via a plurality of interconnects, the assembly including a plurality of temperature activated shape-memory elements.

FIG. 8 is a schematic of a semiconductor device assembly 200E. The semiconductor device assembly 200E includes a first semiconductor device 120A connected to a substrate 110 via a plurality of interconnects 130. As discussed herein, the first semiconductor device 120 may have a warpage at a predetermined temperature, which may be applied to the semiconductor device assembly 200E during processing. The semiconductor device assembly 100 also includes a second semiconductor device 120B connected to the first semiconductor device 120A via a plurality of interconnects 130.

The semiconductor device assembly 200E includes a first shape-memory element 180A, a second shape-memory element 180B, and third shape-memory elements 180C connected to the first semiconductor device 120A. The first shape-memory element 180A is connected on the surface of the first semiconductor device 120A, the second shape-memory element 180B is a layer within the first semiconductor device 120A, and the third shape-memory elements 180C are connected between the first semiconductor device 120A and the substrate 110. Likewise, the semiconductor device assembly 200E includes a first shape-memory element 180A, a second shape-memory element 180B, and third shape-memory elements 180C connected to the second semiconductor device 120B. The first shape-memory element 180A is connected on the surface of the second semiconductor device 120B, the second shape-memory element 180B is a layer within the second semiconductor device 120B, and the third shape-memory elements 180C are connected between the first semiconductor device 120A and the second semiconductor device 120B.

The shapes, sizes, configurations, and/or locations of the shape-memory elements are shown for illustrative purposes and may be varied as would be appreciated by one of ordinary skill in the art having the benefit of this disclosure. For example, semiconductor device 200E may include a first set of shape-memory elements 180 that return to an initial shape at a first predetermined temperature and a second set of shape-memory elements 180 that return to an initial shape at a second predetermined temperature. In this way, the shape-memory elements 180 may be configured to reduce, minimize, or modify a warpage at multiple temperatures applied to the semiconductor device assembly 200E during processing.

Figure 9:
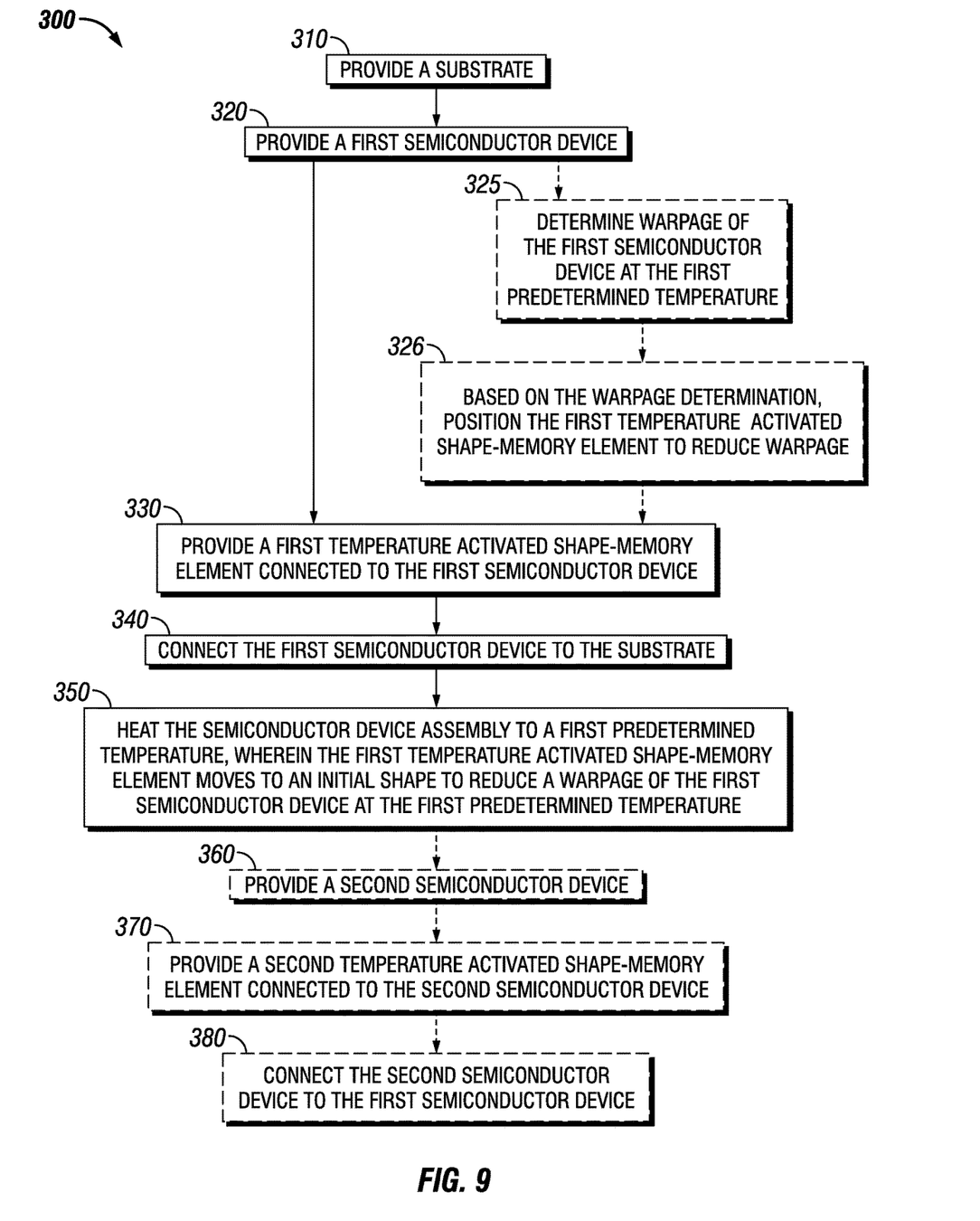
FIG. 9 is a flow chart of an embodiment of a method of making a semiconductor device assembly.

FIG. 9 is a flow chart of an embodiment of a method 300 of making a semiconductor device assembly. The method 300 includes providing a substrate, at 310. The substrate may be a semiconductor device as discussed herein. The method 300 include providing a first semiconductor device, at 320, and providing a first temperature activated shape-memory element connected to the first semiconductor device, at 330. As discussed herein, the shape-memory element could alternatively be connected to the substrate or both the first semiconductor device and the substrate. The method 300 includes connecting the first semiconductor device to the substrate, at 340, and heating the semiconductor device assembly to a first predetermined temperature, wherein the first temperature activated shape-memory element moves to an initial shape to reduce a warpage of the first semiconductor device at the first predetermined temperature, at 350.

The method 300 may include determining the warpage of the first semiconductor device at the first predetermined temperature, at 325. At 326, the method 300 may include positioning the first temperature activated shape-memory element to reduce the warpage based on the warpage determination. The method 300 may include providing a second semiconductor device, at 360, and providing a second temperature activated shape-memory element connected to the second semiconductor device, at 370. The method 300 may include connecting the second semiconductor device to the first semiconductor device, at 380.

Figure 10:
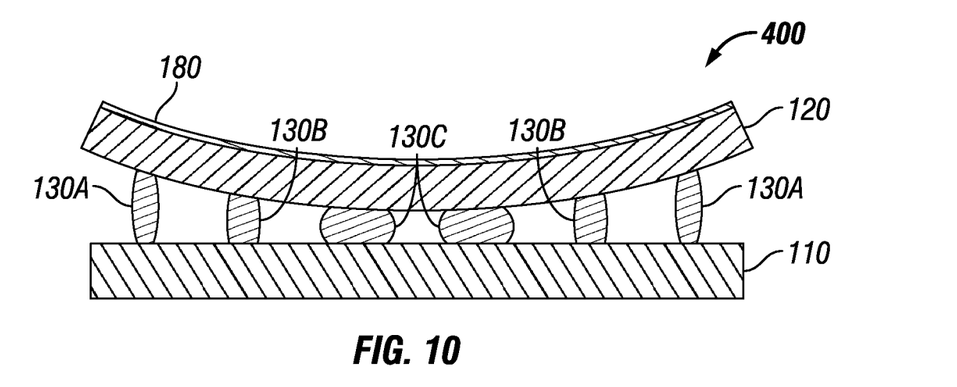
FIG. 10 is a schematic of an embodiment of a semiconductor device assembly comprised of a semiconductor device connected to a substrate via a plurality of interconnects that includes an electrically activated shape-memory element.

FIG. 10 is a schematic of a semiconductor device assembly 400. The semiconductor device assembly 400 includes a first semiconductor device 120 connected to a substrate 110 via a plurality of interconnects 130A, 130B, 130C. The substrate 110 may be a semiconductor device as would be appreciated by one of ordinary skill in the art having the benefit of this disclosure. As shown in FIG. 10, the first semiconductor device 120 may have a warpage at a predetermined temperature. The predetermined temperature may be a temperature applied to the semiconductor device assembly 400 during processing. For example, the predetermined temperature may be, but is not limited to, the temperature the assembly is heated to during a TCB process or during a reflow process. The semiconductor device assembly 400 includes an electrically activated shape-memory element 180 connected to the surface of the first semiconductor device 120. The electrically activated shape-memory element 180 has moved from an initial positioned due to the warpage of the first semiconductor device 120.

Warpage of the first semiconductor device 120 at the predetermined temperature may cause the stretching of some of the interconnects 130A between the first semiconductor device 120 and the substrate 110. The stretching of the interconnects 130A may lead to breaks in the interconnects 130A as would be appreciated by one of ordinary skill in the art having the benefit of this disclosure. Warpage of the first semiconductor device 120 at the predetermined temperature may also cause the compression of some interconnects 130C causing the interconnects 130C to expand laterally, which may cause shorts between interconnects 130C as would be appreciated by one of ordinary skill in the art having the benefit of this disclosure. The number, shape, size, and/or location of the interconnects 130A, 130B, 130C are shown for illustrative purposes and may be varied as would be appreciated by one of ordinary skill in the art having the benefit of this disclosure. Likewise, the warpage of the first semiconductor device 120 is shown for illustrative purpose and may vary depending on the application as would be appreciated by one of ordinary skill in the art having the benefit of this disclosure.

Figure 11:
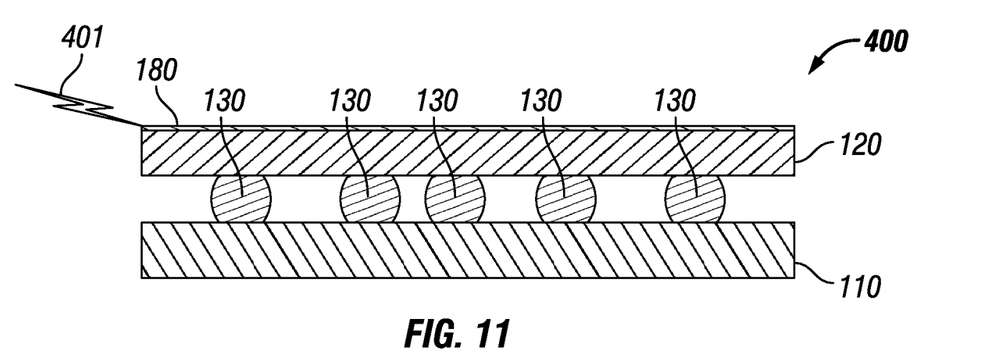
FIG. 11 is a schematic of an embodiment of a semiconductor device assembly comprised of a semiconductor device connected to a substrate via a plurality of interconnects that includes an electrically activated shape-memory element.

FIG. 11 is a schematic of a semiconductor device assembly 400 of FIG. 10 with electricity 401 applied to the electrically activated shape-memory element 180. The application of the electricity 401 causes the electrically activated shape-memory element 180 to return to an initial shape, which has been configured to minimize or reduce the warpage of the semiconductor device 120. Alternatively, the initial shape of the electrically activated shape-memory element 180 may be configured to modify the warpage of the semiconductor device 120 to better conform to the profile or warpage of an adjacent substrate and/or semiconductor device as discussed herein. Reducing or minimizing the warpage of the semiconductor device 120 may ensure adequate interconnects 130 between the semiconductor device 120 and the substrate 110. FIG. 11 shows the shape-memory element 180 connected to the top surface of the semiconductor device 120, but the shape-memory element 180 may be positioned on the bottom surface or may be a layer of the semiconductor device 120 as would be appreciated by one of ordinary skill in the art having the benefit of this disclosure.

Figure 12:
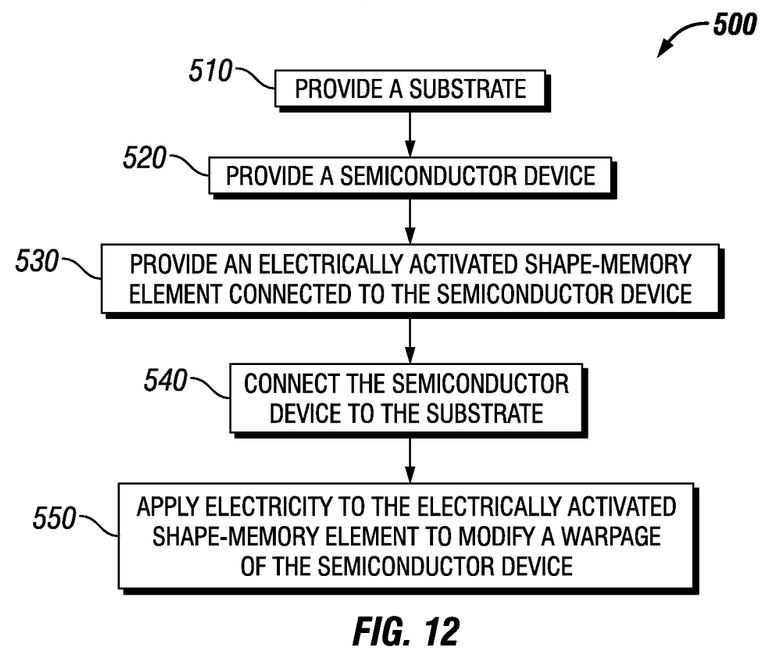
FIG. 12 is a flow chart of an embodiment of a method of making a semiconductor device assembly.

FIG. 12 is a flow chart of an embodiment of a method 500 of making a semiconductor device assembly. The method 500 includes providing a substrate, at 510. The substrate may be a semiconductor device as discussed herein. The method 500 include providing a semiconductor device, at 520, and providing an electrically activated shape-memory element connected to the semiconductor device, at 530. As discussed herein, the shape-memory element could alternatively be connected to the substrate or both the semiconductor device and the substrate. The method 500 includes connecting the semiconductor device to the substrate, at 540, and applying electricity to the electrically activated shape-memory element to modify a warpage of the semiconductor device, at 550.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a semiconductor device;
   a substrate, the semiconductor device being connected to the substrate; and
   an electrically activated shape-memory element connected to the semiconductor device to form an assembly of the substrate, the semiconductor device, and the electrically activated shape-memory element;
   wherein the assembly has a warpage when subjected to an elevated temperature,
   wherein the electrically activated shape-memory element is configured to reduce the warpage of the semiconductor device upon an application of electricity directly to the electrically activated shape-memory element, and
   wherein the electrically activated shape-memory element is directly connected to a surface of the semiconductor device.

2. A semiconductor device assembly of claim 1, comprising:
   a semiconductor device;
   a substrate, the semiconductor device being connected to the substrate; and
   an electrically activated shape-memory element connected to the semiconductor device to form an assembly of the substrate, the semiconductor device, and the electrically activated shape-memory element;
   wherein the assembly has a warpage when subjected to an elevated temperature,
   wherein the electrically activated shape-memory element is configured to reduce the warpage of the semiconductor device upon an application of electricity directly to the electrically activated shape-memory element, and
   wherein the electrically activated shape-memory element comprises a layer within the semiconductor device.

3. The semiconductor device assembly of claim 1, further comprising one or more electrical interconnects between the semiconductor device and the substrate.

4. The semiconductor device assembly of claim 1, wherein the electrically activated shape-memory element moves back to an initial shape upon the application of electricity directly to the electrically activated shape-memory element to reduce the warpage.

5. The semiconductor device assembly of claim 4, wherein the initial shape is a relatively flat layer on the surface of the semiconductor device.

6. The semiconductor device assembly of claim 2, wherein the initial shape is a relatively flat layer within the semiconductor device.

7. A semiconductor device assembly comprising:
   a semiconductor device;
   a substrate, the semiconductor device being connected to the substrate;
   an electrically activated shape-memory element directly contacting the semiconductor device to form an assembly of the substrate, the semiconductor device, and the electrically activated shape-memory element, wherein the electrically activated shape-memory element is connected between the semiconductor device and the substrate;
   one or more electrical interconnects between the semiconductor device and the substrate;
   wherein the assembly has a warpage when subjected to an elevated temperature; and wherein the electrically activated shape-memory element is configured to return to an initial shape upon an application of electricity directly to the electrically activated shape-memory element.

8. The semiconductor device assembly of claim 7, wherein the return of the electrically activated shape-memory element to the initial shape reduces the warpage of the assembly.

9. The semiconductor device assembly of claim 7, wherein the substrate has a first warpage having a first curvature at the elevated temperature and the semiconductor device has a second warpage having a second curvature at the elevated temperature, the first curvature differing from the second curvature.

10. The semiconductor device assembly of claim 9, wherein the return of the electrically activated shape-memory element to the initial shape causes the second curvature to substantially conform to the first curvature.

\* \* \* \* \*